United States Patent

Ko

Patent Number: 5,703,580
Date of Patent: Dec. 30, 1997

[54] APPARATUS FOR ENCODING AND DECODING RUN LENGTH LIMITED CODE DATA

[75] Inventor: Jung-wan Ko, Suwon, Rep. of Korea

[73] Assignee: Samsung Elecrtronics Co., Ltd., Kyungki-Do, Rep. of Korea

[21] Appl. No.: 678,601

[22] Filed: Jul. 15, 1996

[30] Foreign Application Priority Data

Aug. 9, 1995 [KR] Rep. of Korea ............ 95-24534

[51] Int. Cl.$^6$ .................................... H03M 7/00
[52] U.S. Cl. ............. 341/59; 341/100; 341/101; 341/58
[58] Field of Search ............... 341/101, 106, 341/59, 100, 58

[56] References Cited

U.S. PATENT DOCUMENTS

| | | | |
|---|---|---|---|
| 4,724,422 | 2/1988 | Golab | 341/78 |
| 4,818,900 | 4/1989 | Klass et al. | 307/450 |
| 4,864,303 | 9/1989 | Ofek | 341/95 |
| 4,887,084 | 12/1989 | Yamaguchi | 341/160 |
| 4,971,407 | 11/1990 | Hoffman | 341/87 |
| 5,046,182 | 9/1991 | Hamstra et al. | 370/79 |
| 5,144,304 | 9/1992 | McMahon et al. | 341/58 |
| 5,270,714 | 12/1993 | Tanaka et al. | 341/59 |
| 5,349,350 | 9/1994 | Blagaila | 341/59 |
| 5,471,208 | 11/1995 | Sauer | 341/120 |
| 5,517,533 | 5/1996 | Szmauz et al. | 375/354 |
| 5,528,237 | 6/1996 | Moloney et al. | 341/59 |

*Primary Examiner*—Jeffrey A. Gaffin
*Assistant Examiner*—Peguy JeanPierre
*Attorney, Agent, or Firm*—Sughrue, Mion, Zinn, Macpeak & Seas, PLLC

[57] ABSTRACT

The present invention relates to an apparatus for modulating input data by encoding the data to a run length limited (RLL) code data satisfying the (d,k,m,n) condition and decoding the modulated data, in which d is a minimum run length, k is a maximum run length, m is the bit number of input code data, n is the bit number of transmission code data, and the encoding and decoding apparatus according to the present invention comprises a look-up table (LUT) for encoding input parallel m-bit code data to r-bit code data in which r is not less than m and less than n, a post-encoder for encoding the encoded r-bit data to an n-bit transmission code data, a pre-decoder for decoding the input n-bit transmission code data to the r-bit code data according to the minimum run length condition, and a LUT for decoding the decoded r-bit code data to the original m-bit code data, by which the transmission code length is shortened according to the minimum run length condition so that the memory size required for encoding and decoding RLL code data can be reduced.

27 Claims, 4 Drawing Sheets

APPARATUS FOR ENCODING AND DECODING RUN LENGTH LIMITED CODE DATA

BACKGROUND OF THE INVENTION

The present invention relates to an apparatus for encoding and decoding run length limited (RLL) code data, and more particularly to an encoding and decoding apparatus for modulating input data by encoding the input data to run length limited (RLL) code data and decoding the modulated RLL code data, in which the transmission code length is shortened according to the minimum run length condition so that the memory size required for encoding and decoding RLL code data can be reduced.

In communications and recording apparatus, the transmission and reception of video and audio signals is performed by converting the video and audio signals to digital signals, source coding or channel coding the converted signals, transmitting the coded signals or storing the coded signals on a magnetic medium or an optical medium, and then reproducing the transmitted or stored signals by means of source decoding or channel decoding.

Source coding is a method for compressing the size of source data by removing the redundancy of source data. Channel coding is a method for enhancing system reliability with respect to error occurrence on a channel by adding redundancy. Such channel coding is also referred to as modulation.

In the channel coding method for digital data, the data encoded by RLL coding methods (hereinafter referred to as "RLL code data") satisfies a (d,k,m,n) condition. Here, d is the minimum length of running 0's (hereinafter, called the minimum run length), k is the maximum length of running 0's (hereinafter, called the maximum run length), m is the number of input data bits to an encoder (hereinafter, called the bit number of the input code), n is the number of bits in modulated transmission code data (hereinafter, called the bit number of transmission code).

Such RLL code data is also referred to as "(d,k)-constrained RLL code data" because the number of running zeros is constrained to be not less than d and not more than k.

An encoder for modulating m input data bits into n bits of RLL data satisfying the condition of (d,k,m,n) and a decoder for demodulating transmitted code data generally use a ROM constituted by a look-up table.

A coding efficiency is usually expressed as m/n, and as the values of m and n become larger, the efficiency becomes higher while maintaining the same conditions of (d,k). This is because the combination of codes capable of occurrence increases at the rate of the square of two and the number of the codes satisfying the (d,k) condition increases relatively as m and n increase.

However, as the m and n values of the RLL code data increase, the look-up table size of the decoder increases at the rate of the square of two. That is, the look-up table size of the decoder doubles as the word length n of the transmission code data input to a decoder increases by one bit. In the case of an encoder, because the number bits of output data of the look-up table is to be increased linearly by n, the configuration of the encoder memory is also complicated.

For example, in the case of converting input 8-bit data into 16-bit channel data, the memory size of a look-up table used in the encoder requires at least $2^8 \times 16$ bits and the memory size of a look-up table used in the decoder requires a size corresponding to $2^{16} \times 8$ bits.

SUMMARY OF THE INVENTION

An object of the present invention is to provide a decoding apparatus for decoding RLL code data which uses a pre-decoding code for shortening the word length of transmission code data according to a minimum run length condition to decode the transmission code so that the memory size required for decoding RLL code data can be reduced.

Another object of the present invention is to provide an encoding apparatus for encoding RLL code data which uses a post-encoding code for making the word length of input data shorter than that of the transmission code data according to the minimum run length condition to encode the input code data so that the memory size required for encoding RLL code data can be reduced.

To achieve the first object, a decoding apparatus according to the present invention for run length limited (RLL) code data satisfying a (d,k,m,n) condition, in which d is a minimum run length, k is a maximum run length, m is the number of bits of the input code data, and n is the number of bits of the transmission code data, comprises:

pre-decoding means for decoding input parallel n-bit transmission code data to r-bit code data according to the minimum run length condition, in which r is not less than m and less than n; and decoding means for decoding the r-bit coded data into m-bit code data.

To achieve the second object, an encoding apparatus according to the present invention for run length limited code data satisfying a (d,k,m,n) condition, in which d is the minimum run length, k is the maximum run length, m is the bit number of an input code data, and n is the bit number of a transmission code, comprises:

encoding means for encoding input parallel m-bit code data to r-bit code data in which r is not less than m and less than n; and post-encoding means for encoding the encoded r-bit code data to an n-bit transmission code according to the minimum run length condition.

BRIEF DESCRIPTION OF THE DRAWINGS

The above objects and advantages of the present invention will become more apparent by detailed descriptions of preferred embodiments thereof with reference to the attached drawings in which.

DETAILED DESCRIPTION OF THE INVENTION

Figure 1:
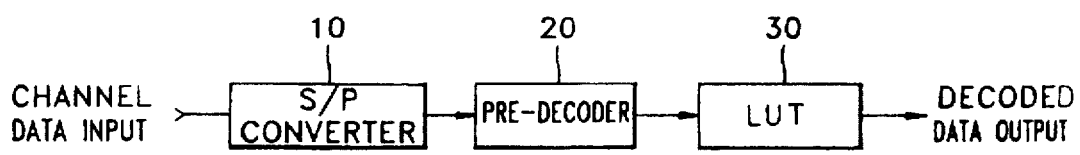
FIG. 1 is a block diagram of a decoding apparatus according to the present invention for RLL code data.

First, characteristics of a pre-decoder according to the present invention for reducing the bit number of input transmission code data according to the minimum run length condition will be described below.

(d,k)-constrained RLL code data should have a number of 0's not less than d and not more than k.

The minimum run length condition d is the parameter primarily considered in the present invention, and the word length of input data can be reduced in such ratios as shown in Table 1 by using mappers.

Because d number of "0's" must be between two successive "1's," the number of instances of the data satisfying the (d,k) condition is restricted when a bit interval is selected.

In the case of successive 3-bit data when d is 2, the combinations of "000," "001," "010" and "100" can be generated while combinations of "011," "101," "110," and "111" cannot be generated because these latter combinations do not satisfy the minimum run length condition d. When d is 2 and the bit interval is 3, the decoding apparatus for the RLL code data uses a pre-decoder for dividing the input data into units of 3 bits, converting the 3-bit data to 2-bit data, specifically, "000" to "00," "001" to "01," "010" to "10" and "100" to "11." Decoding is subsequently performed on the 2-bit data, and a look-up table for decoding the output of the pre-decoder to the original m-bit data is reduced.

TABLE 1

| d | i | j | reduction ratio |
| --- | --- | --- | --- |
| 1 | 4 | 3 | 3/4 |
| 2 | 3 | 2 | 2/3 |
| 3 | 5 | 3 | 3/5 |
| 4 | 6 | 3 | 1/2 |
| 5 | 9 | 4 | 4/9 |
| 6 | 10 | 4 | 2/5 |
| 7 | 11 | 4 | 4/11 |
| 8 | 12 | 4 | 1/3 |
| 9 | 16 | 5 | 5/16 |
| 10 | 17 | 5 | 5/17 |
| 11 | 18 | 5 | 5/18 |
| 12 | 19 | 5 | 5/19 |
| 13 | 20 | 5 | 1/4 |
| 14 | 21 | 5 | 5/21 |
| 15 | 22 | 5 | 5/22 |
| 16 | 23 | 5 | 5/23 |
| 17 | 24 | 5 | 5/24 |
| 18 | 25 | 5 | 1/5 |

A conversion ratio of the pre-decoder is determined by the minimum run length condition (d). Table 1 shows effective mapper conditions while satisfying the d condition. Here, the efficiency of the pre-decoder increases as the value of d increases, because the number of combinations satisfying the run length condition decreases as the value of d increases.

The pre-decoder also needs to be simplified because the pre-decoder is a means for reducing the size of the look-up table. Because the complexity of the pre-decoder is directly proportional to the number of input bits input to the pre-decoder, it is advantageous to use a mapper which has a large reduction ratio while having an input bit number as small as possible. Table 1 has been constructed to satisfy this condition.

Namely, Table 1 shows the input word length i of mappers which can reduce the input bit number effectively, the output word length j thereof, and the ratio of the output word length j with respect to the input word length i.

The word length of the transmission code can be shortened by selecting mappers of minimum run length not more than d among the mappers described in Table 1 according to a predetermined minimum run length d of the transmission code data. For example, when d is 4, a mapper having such reduction ratios as 6-to-3, 5-to-3, 3-to-2 or 4-to-3 can be used. The combination of mappers constituted as simply as possible is more effective to reduce the word length of the transmission code data.

The preferred embodiments of the decoding and the encoding apparatus for the RLL code data according to the present invention will be described below.

FIG. 1 is a block diagram of the decoding apparatus for the RLL code data according to the present invention. The serial-parallel (hereinafter referred to as S/P) converter 10 described in FIG. 1 converts serial n-bit RLL code data into parallel n-bit RLL code data. A detector for detecting a signal sequence from the data transmitted from a channel or reproduced from a recording medium can be positioned upstream from the S/P converter 10. Moreover, a NRA (Non Return to Zero) converter for converting NRZI data into its original NRA data can be also positioned at the front of the S/P converter 10 in systems for performing a recording operation in the state of pulse width modulation by NRZI (non return to zero inverted).

The pre-decoder 20, comprising by a combination of the most efficient mappers as described in Table 1 according to the minimum run length condition, converts the parallel n-bit transmission code data into parallel r-bit code data in which r is smaller than n (herein referred to as r-bit).

The look-up table 30 (hereinafter referred as "LUT") whose bit size is $2^r \times m$ bits, receives the parallel r-bit data, decodes it to m-bit decoded data for output with a number of bits which is the same as that of the original input code thereof.

Figure 2:
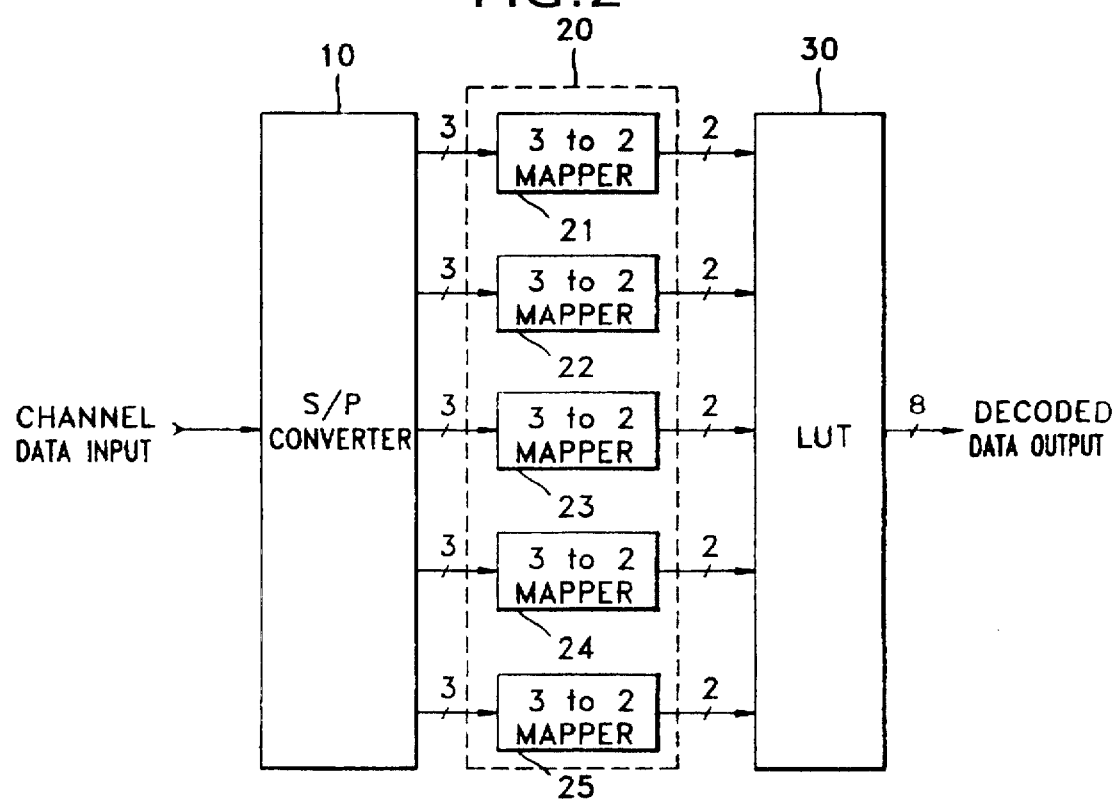
FIG. 2 illustrates a block diagram of an embodiment of the decoding apparatus according to the present invention for (2,12,8,15) code data.

FIG. 2 illustrates an embodiment of the decoding apparatus according to the present invention for (2,12,8,15) code data. In FIG. 2, the S/P converter 10 converts encoded serial 15-bit transmission code data into parallel 15-bit transmission code data.

The pre-decoder 20 maps the parallel 15-bit transmission code data to 10-bit code data by using five 3-to-2 mappers 21–25. Here, the pre-decoder 20 comprises a combination of mappers so that the sum of the output word length j of each mapper is minimized, and the sum of the input word length i of each mapper is the closest to the bit number n of the transmission code data, i.e., equal to or less than n.

If the sum of the input word length i of each mapper in the pre-decoder is less than n, the remaining bits not being input to the pre-decoder 20 are directly transmitted to the LUT 30.

It is further noted that for equal reduction ratios, the mapper having smaller input word length i is more effective to reduce the hardware size of pre-decoder. That is, the value of the input word length i is a parameter determining the size of the circuit constituting the pre-decoder. In other words, with the reduction ratio constant, the smaller the input word length i of a mapper, the smaller the circuit size of the mapper. For example, the hardware size of two 3-to-2 mappers is smaller than that of one 6-to-4 mapper.

For the pre-decoder 20 shown in FIG. 2 as another example, the pre-coder may comprise two 6-to-4 mappers or four 3-to-2 mappers, but this configuration is more complicated than the circuit illustrated in FIG. 2.

The LUT 30 receives five 2-bit code data output from the five 3-to-2 mappers 21–25 and decodes the five 2-bit code data to 8-bit code data for output.

The word length of the transmission code of the (2,12,8, 15) code data is fifteen. When the 15-bit data is decoded by using a LUT, the memory size of the LUT required for decoding is $2^{15} \times 8$ bits in conventional decoding. In the present invention, because the word length of the data input to the LUT 30 via the five 3-to-2 mappers 21–25 is 10 bits, which is a value reduced by 5 bits with respect to the prior art, the size of the LUT is reduced to 1/32 of that conventionally required.

Figure 3:
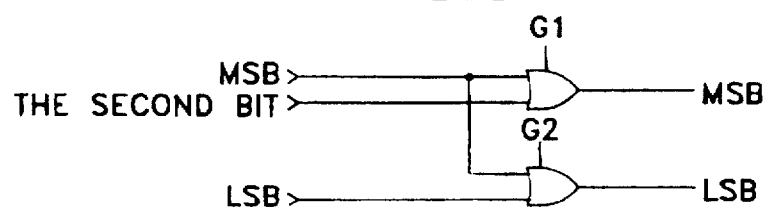
FIG. 3 is a detailed circuit diagram of the 3-to-2 mapper shown in FIG. 2.

FIG. 3 is a detailed circuit diagram of one of the 3-to-2 mappers described in FIG. 2. The 3-to-2 mapper in FIG. 3, as an embodiment according to the present invention, comprises a simple logic circuit using two OR gates G1 and G2. But, when the mapping condition is changed, the circuit thereof may be changed. The 3-to-2 mapper may also comprise a look-up table as well.

According to FIG. 3, the OR gate G1 sums logically the (MSB) and the second significant bit among 3-bit codes divided from the n-bit transmission code, and outputs the result thereof as the most significant bit (MSB).

The OR gate G2 sums logically the most significant bit (MSB) and the least significant bit (LSB) among 3-bit codes divided from the n-bit transmission code, and outputs the result thereof as the least significant bit (LSB).

Table 2 shows the code map of the 3-to-2 mapper described in FIG. 3.

TABLE 2

| channel data | pre-decoder output |
| --- | --- |
| 0 0 0 | 0 0 |
| 0 0 1 | 0 1 |
| 0 1 0 | 1 0 |
| 1 0 0 | 1 1 |
| others | xxx |

Figure 4:
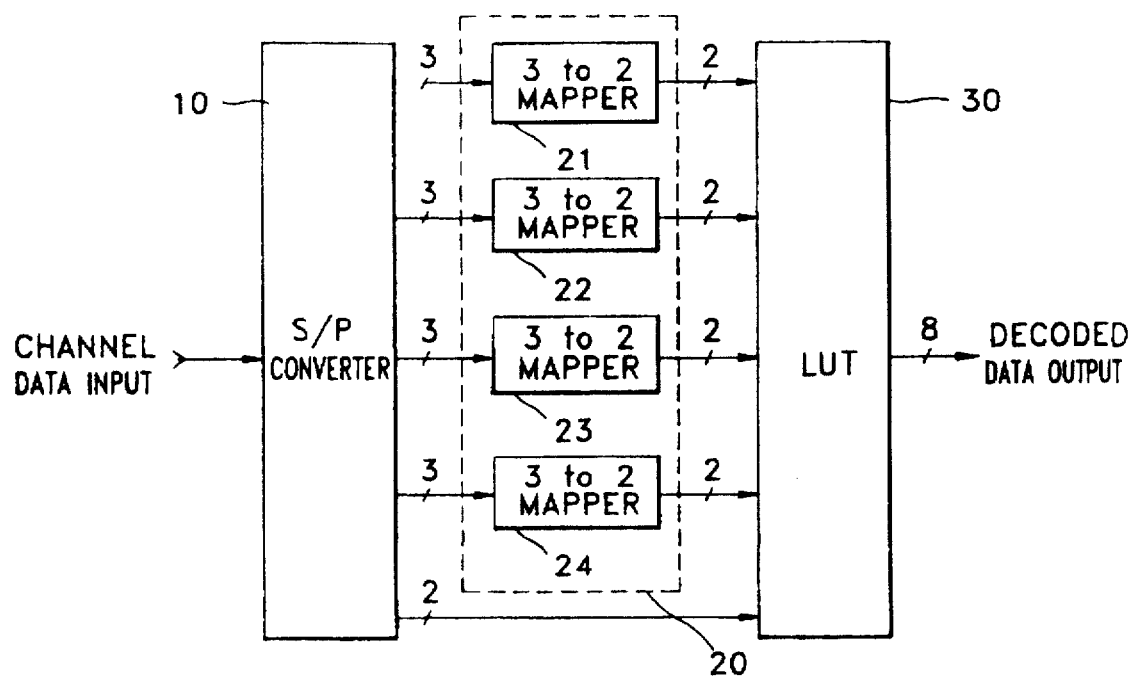
FIG. 4 illustrates a block diagram of another embodiment of the decoding apparatus according to the present invention for EFM code data.

FIG. 4 is a block diagram of the decoding apparatus for a EFM code as another embodiment according to the present invention, in which the same reference numerals shown in FIG. 2 are given to each unit having a similar construction as a unit shown in FIG. 2.

EFM (eight to fourteen modulation) code used in a compact disc has such conditions as d=2, k=10, m=8 and n=14, and is also referred to as the (2,10) code.

The S/P converter 10 converts the coded serial 14-bit transmission code into parallel 14-bit transmission code.

The pre-decoder 20 converts only 12 bits of the 14 bits of the parallel transmission code output from the S/P converter 10 into 8-bit code by the four 3-to-2 mappers 21–24, and transmits the remaining 2-bit transmission code directly to the LUT 30 without passing through a mapper.

The LUT 30 receives the 8-bit code data output from the pre-decoder 20 and the 2-bit data output directly from the S/P converter 10 without passing through the pre-decoder 20, and then outputs the decoded data of the original 8 bits.

Here, the word length of the transmission code for the EFM code is 14 bits. When 14-bit code data is decoded by using the LUT without a pre-decoder according to the prior art, the memory size of $2^{14} \times 8$ bits is required. But, according to the present invention, the size of the LUT can be reduced by 1/16 because the input word length of the LUT 30 becomes 10 bits reduced by 4 bits with respect to the prior art by using multiple 3-to-2 mappers 21–24.

Figure 5:
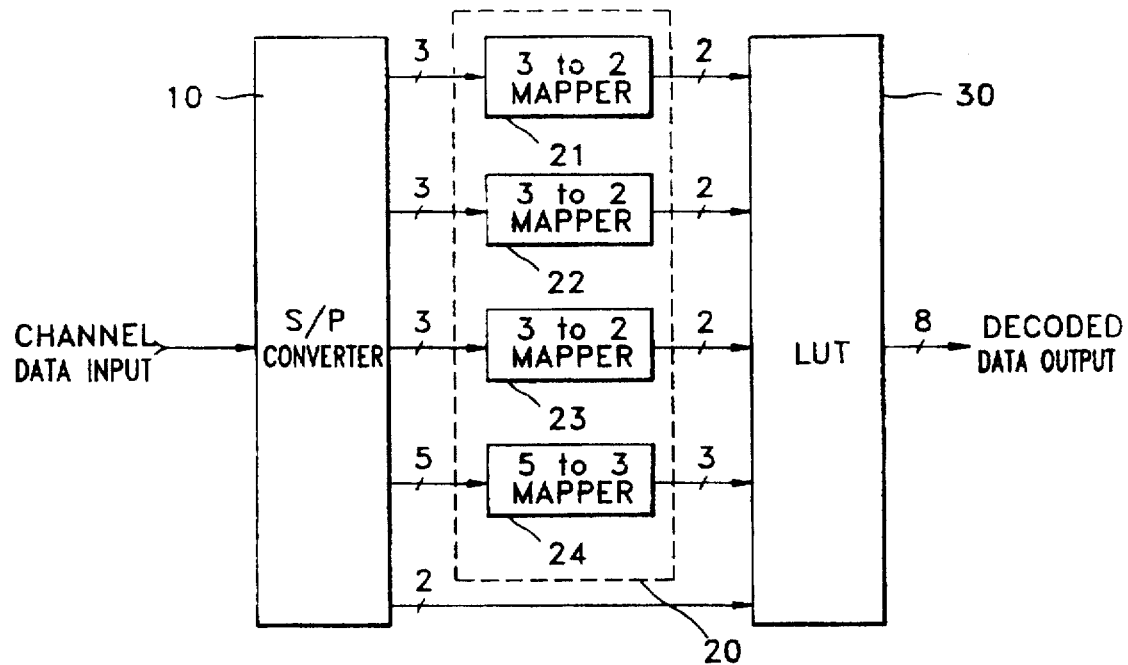
FIG. 5 illustrates a block diagram of another embodiment of the decoding apparatus according to the present invention for (2,10,8,16) code data.

FIG. 5 illustrates another embodiment of the decoding apparatus according the present invention for a (2,10,8,16) code data in which the same reference numerals shown in FIG. 2 are given to each unit having a similar construction as a unit shown in FIG. 2.

According to FIG. 5, the S/P converter 10 converts coded serial 16-bit transmission code data into parallel 16-bit transmission code data.

The pre-decoder 20 converts only 14 bits of the 16 bits of the parallel transmission code data output from the S/P converter 10 into 9-bit code data by using the three 3-to-2 mappers 21–23 and the one 5-to-3 mapper 27, and transmits the remaining 2 bits of transmission code data to the LUT 30 directly without passing through a mapper.

The LUT 30 receives the 9-bit code data output from the pre-decoder 20 and the 2-bit transmission code data output directly from the S/P converter 10 without passing the pre-decoder 20, and then outputs decoded data of the original 8-bit code.

Here, the word length of the transmission code for a (2,12,8,16) code is 16 bits. When 16-bit code data is decoded by using the LUT without a pre-decoder as in the prior art, the memory size of $2^{16} \times 8$ bits is required. However, according to the present invention, the LUT size can be reduced by 1/32 of the memory size conventionally required because the input word length of the LUT 30 becomes 11 bits, reduced by 5 bits with respect to the prior art by using the mappers 21–24.

Figure 6:
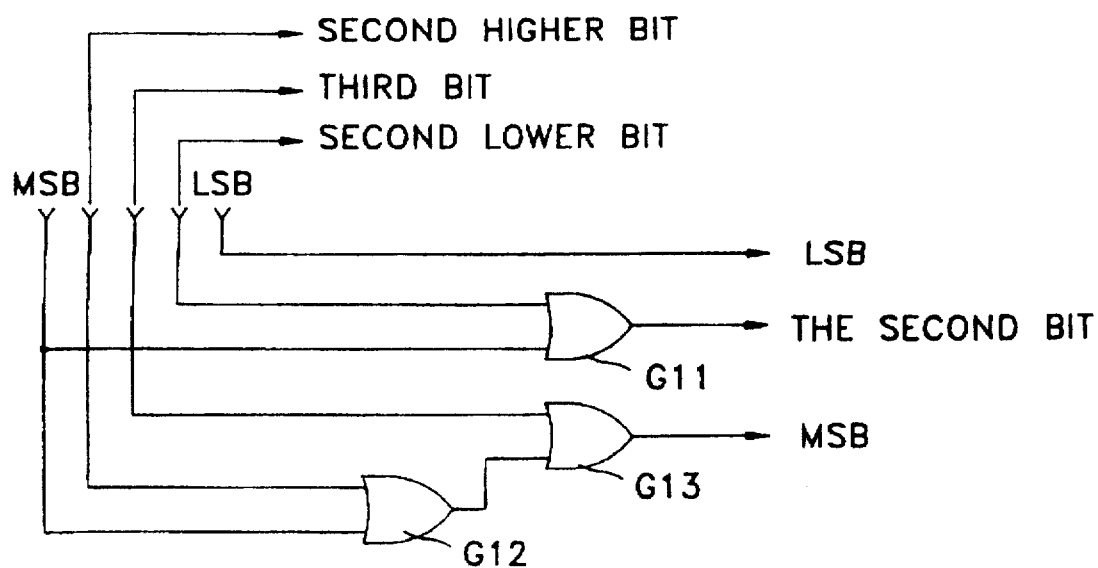
FIG. 6 is a detailed circuit diagram of the 5-to-3 mapper shown in FIG. 4.

FIG. 6 is a detailed circuit diagram of the 5-to-3 mapper shown in FIG. 5, comprising multiple OR gates G11 through G13.

According to FIG. 6, the OR gate G11 logically sums the MSB and the second least significant bit of the 5-bit transmission code data which is divided from the 16-bit transmission code data, and then outputs the result thereof as the secondary bit of the 3-bit code data for output. The OR gate G12 logically sums the MSB and the second most significant bit of the 5-bit transmission code data. The OR gate G13 logically sums the third lower bit of the 5-bit transmission code data and the output of the OR gate G12, and then outputs the result thereof as the MSB of the 3-bit code data for output. The LSB of the 5-bit transmission code data is directly output as the LSB of the 3-bit code data for output.

The code map of the 5-to-3 mapper shown in FIG. 6 is described in the following Table 3.

TABLE 3

| Channel Data | Pre-decoder output |
| --- | --- |
| 00000 | 0 0 0 |
| 00001 | 0 0 1 |
| 00010 | 0 1 0 |
| 00100 | 1 0 0 |
| 01000 | 1 0 0 |
| 10000 | 1 1 0 |
| 10001 | 1 1 1 |
| Others | xxxxx |

Table 2 shows the code map of the 3-to-2 mapper which can be used when d=2, and Table 3 shows the code map of the 5-to-3 mapper which can be used when d=3. Here, the mapper may comprise a logic circuit as shown in FIGS. 3 and 6 or may comprise memory look-up tables.

As described above, because the number of 0's positioned between the successive 1's of the RLL code is restricted, only a portion of the codes having the input word length i of the mapper can be used as shown in Tables 2 and 3.

Moreover, the mappers shown in Tables 1 to 3 can be used in the encoder in a reverse arrangement.

Figure 7:
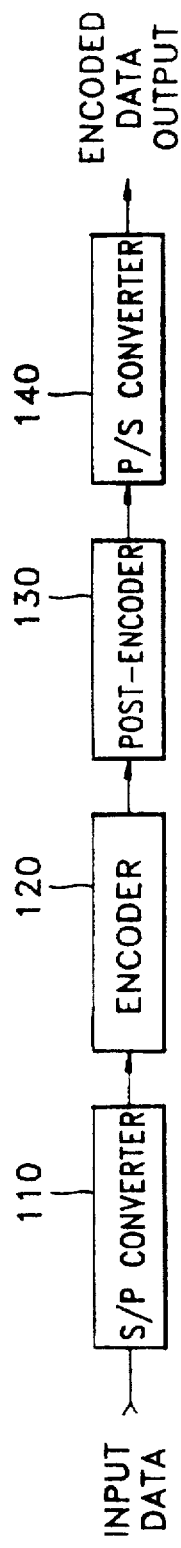
FIG. 7 is a block diagram of an encoding apparatus for RLL code data according to the present invention.

FIG. 7 is a block diagram of the encoding apparatus for the RLL data according to the present invention.

According to FIG. 7, the S/P converter 110 converts the input serial m-bit data into parallel m-bit data. The LUT 120, whose memory size is $2^m \times r$ bits, receives the parallel m-bit input code data and outputs r-bit encoded data in which r is more than m and less than n.

The post-encoder 130 converts the encoded r-bit data into n-bit channel code data so as to satisfy the RLL condition. The P/S converter 140 converts the parallel n-bit channel code data into serial n-bit transmission code data, and then transmits the serial n-bit transmission code data via a channel or records it on a recording medium.

Though not described in FIG. 7, a NRZI converter, an equalizer or recording amplifier, etc. can also be located downstream from the P/S converter 140.

Figure 8:
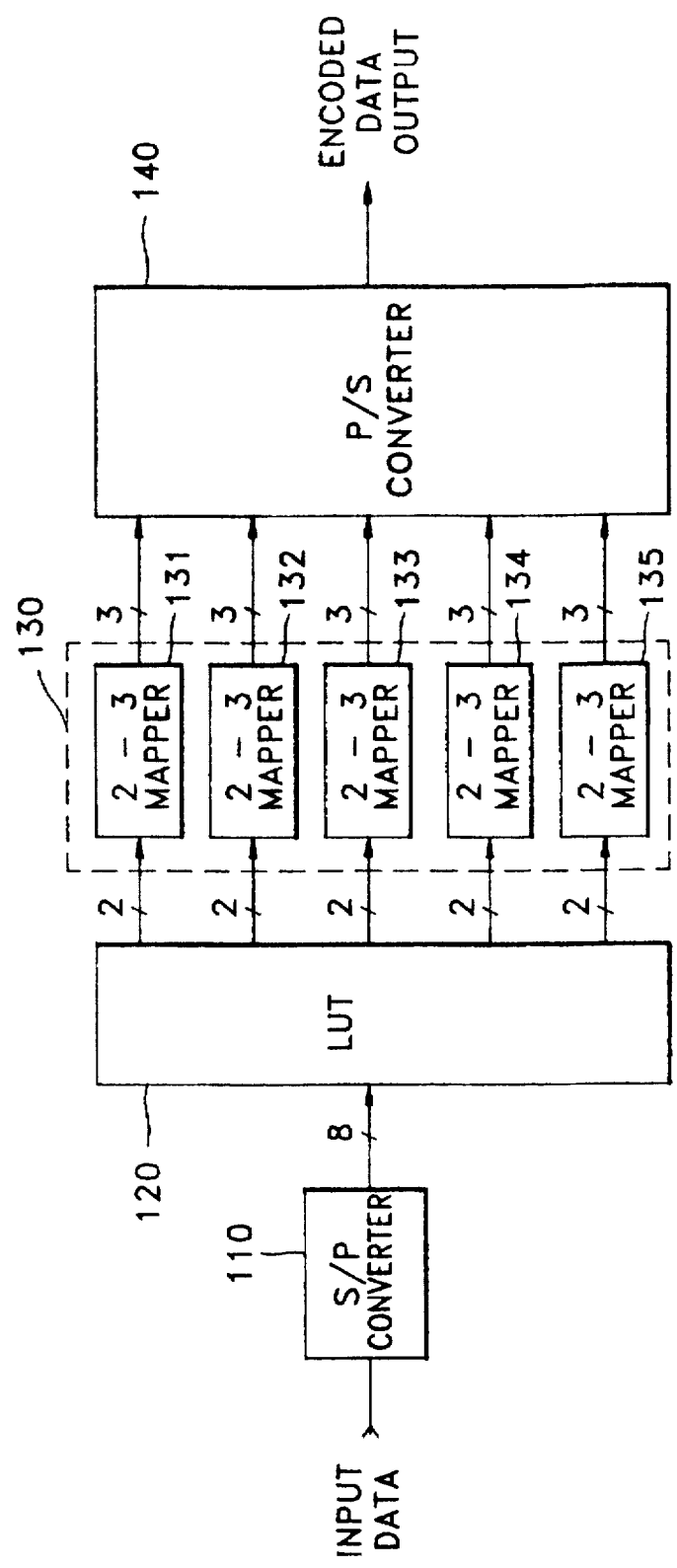
FIG. 8 illustrates a block diagram of an embodiment of an encoder according to the present invention for (2,12,8,15) code data.

FIG. 8 illustrates an embodiment of the encoding apparatus according to the present invention for (2,12,8,15) code data, which is described below with reference to FIG. 9.

According to FIG. 8, the S/P converter 110 converts serial 8-bit code data into parallel 8-bit code data, and then transmits the serial 8-bit code data to the LUT 120.

The LUT 120 receives the parallel 8-bit data and outputs 10-bit coded data. For example, assuming that the encoded RLL transmission data for output should be "000100010001001" when the parallel 8-bit data input to the LUT 120 satisfying the condition of (d,k,m,n)=(2,12,8,15) is xxxxxxxx, the LUT 120 is constituted so that the output of the LUT 120 becomes "0011100101" of a 10-bit word length for transmission to the five 2-to-3 mappers 131–135 in the post-encoder 130 instead of being transmitted as "000100010001001" of a 15-bit word length for direct output.

Figure 9:
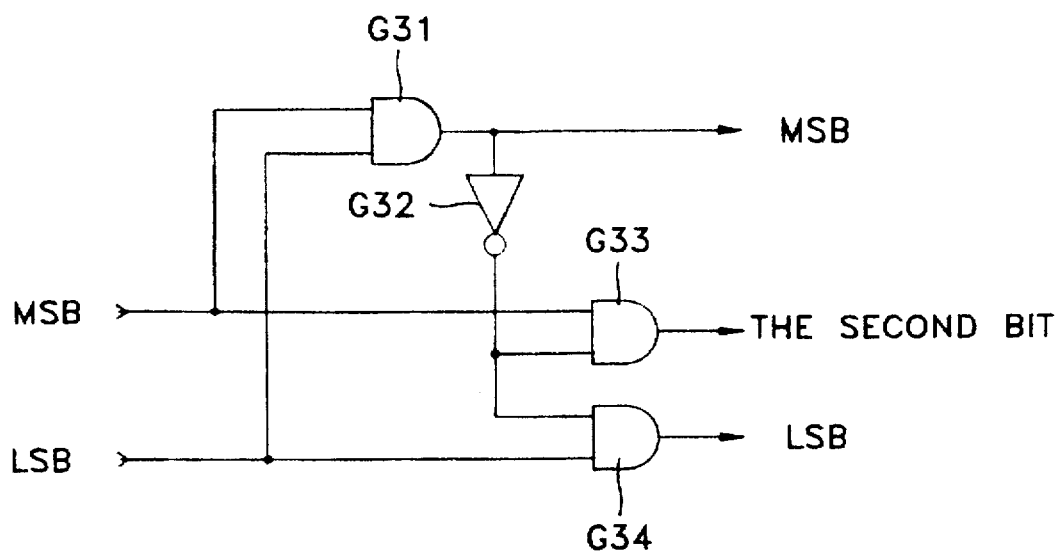
FIG. 9 is a detailed circuit diagram of the 2-to-3 mapper shown in FIG. 8.

Here, the mapping table of the 2-to-3 mapper is constructed in a reverse configuration of Table 2 in which the corresponding inputs and outputs in Table 2 are respectively exchanged, and the 2-to-3 mapper comprises a simple logic circuit as shown in FIG. 9.

According to FIG. 9, the AND gate G31 logically multiplies each bit of the 2-bit data transmitted from the LUT 120, i.e., MSB and LSB, and then outputs the result thereof as the MSB of the 3-bit code data for output. The AND gate G33 logically multiplies the output of the inverter G32 for inverting the output of the AND gate G31 and the MSB of the 2-bit data transmitted from the LUT 120, and then outputs the results thereof as the second bit of the 3-bit for output. The AND gate G34 logically multiplies the output of the inverter G32 and the LSB of the 2-bit data transmitted form the LUT 120, and then outputs the result thereof as the LSB of the 3-bit data for output.

Here, similar to the decoding apparatus, if the mapping method of the code is changed, the circuit of the mappers in the encoding apparatus should be also changed. Moreover, it is obvious to a person skilled in the art that the mappers may comprise look-up tables instead of a logic circuit.

The post-encoder 130 encodes the 10-bit code data transmitted from the LUT 120 into such 15-bit transmission code data as "000100010001001," and then transmits the 15-bit code data to the P/S inverter 140 for final output.

That is, in above case, while the encoding apparatus according to the prior art has a look-up table whose input is 8 bits and whose output is 15 bits, the encoding apparatus according to the present invention uses a post-encoder comprising multiple 2-to-3 mappers, performing an opposite function of the 3-to-2 mappers, satisfying a (d,k,m,n) condition so that the look-up table has 10-bit output with respect to 8-bit input whereby the size of the look-up table can be reduced by two-thirds with respect to the prior art.

The present invention can be used widely for a digital transmission apparatus, especially for a magnetic recording apparatus and an optical recording-reproducing apparatus.

As described above, the present invention can reduce the memory size required for encoding or decoding the RLL code data by shortening the code length according to the minimum run length condition.

What is claimed is:

1. A decoding apparatus for run length limited (RLL) code data satisfying a (d,k,m,n) condition, in which d is a minimum run length, k is a maximum run length, m is the number of bits of input code data, and n is the bit number of bits of transmission code data, said decoding apparatus comprising:

pre-decoding means for decoding input parallel n-bit transmission code data to r-bit code data in which r is not less than m and less than n, wherein r is set according to said minimum run length condition d; and decoding means for decoding said r-bit code data to m-bit code data.

2. A decoding apparatus for RLL code data as claimed in claim 1, wherein said pre-decoding means comprises at least one mapper which can reduce an input word length to an output word length as shown in the following Table 1:

TABLE 1

| d | i | j | reduction ratio |
|---|---|---|---|
| 1 | 4 | 3 | 3/4 |
| 2 | 3 | 2 | 2/3 |
| 3 | 5 | 3 | 3/5 |
| 4 | 6 | 3 | 1/2 |
| 5 | 9 | 4 | 4/9 |
| 6 | 10 | 4 | 2/5 |
| 7 | 11 | 4 | 4/11 |
| 8 | 12 | 4 | 1/3 |
| 9 | 16 | 5 | 5/16 |
| 10 | 17 | 5 | 5/17 |
| 11 | 18 | 5 | 5/18 |
| 12 | 19 | 5 | 5/19 |
| 13 | 20 | 5 | 1/4 |
| 14 | 21 | 5 | 5/21 |
| 15 | 22 | 5 | 5/22 |
| 16 | 23 | 5 | 5/23 |
| 17 | 24 | 5 | 5/24 |
| 18 | 25 | 5 | 1/5 | according to said minimum run length condition.

3. A decoding apparatus for RLL code data as claimed in claim 2, wherein said mappers comprise a logic circuit.

4. A decoding apparatus for RLL code data as claimed in claim 2, wherein said mappers comprise one or more look-up tables.

5. A decoding apparatus for RLL code data as claimed in claim 2, wherein said pre-decoding means comprises a combination of mappers such that the sum of the output word lengths of the mappers can be minimized.

6. A decoding apparatus for RLL code data as claimed in claim 2, wherein said pre-decoding means comprises a combination of mappers having a minimum input word length for each mapper.

7. A decoding apparatus for RLL code data as claimed in claim 1, further comprising converting means for converting input transmission code data into said n-bit parallel transmission code data and for transmitting the converted parallel transmission code data to said pre-decoding means.

8. A decoding apparatus for RLL code data as claimed in claim 1, wherein said decoding means comprises a look-up-table of $2^r \times m$ bit size.

9. A decoding apparatus for RLL code data as claimed in claim 1, wherein said RLL code satisfies the (d,k,m,n) condition of (2,12,8,15).

10. A decoding apparatus for RLL code data as claimed in claim 9, wherein said pre-decoding means comprises a plurality of 3-to-2 mappers.

11. A decoding apparatus for RLL code data as claimed in claim 10, wherein said pre-decoding means reduces the word length of the transmission code data from 15 bits to 10 bits.

12. A decoding apparatus for RLL code data as claimed in claim 1, wherein said RLL code satisfies the (d,k,m,n) condition for eight to fourteen modulation code data of (2,10,8,14).

13. A decoding apparatus for RLL code data as claimed in claim 12, wherein said pre-decoding means comprises a plurality of 3-to-2 mappers.

14. A decoding apparatus for RLL code data as claimed in claim 13, wherein said pre-decoding means reduces the word length of the transmission code data from 14 bits to 9 bits.

15. A decoding apparatus for RLL code data as claimed in claim 1, wherein said RLL code data satisfies the (d,k,m,n) condition of (2,10,8,16).

16. A decoding apparatus for RLL code data as claimed in claim 15, wherein said pre-decoding means comprises a plurality of 3-to-2 mappers and a 5-to-3 mapper.

17. A decoding apparatus for RLL code data as claimed in claim 16, wherein said pre-decoding means reduces the word length of the transmission code data from 16 bits to 11 bits.

18. An encoding apparatus for run length limited (RLL) code data satisfying a (d,k,m,n) condition in which d is a minimum run length, k is a maximum run length, m is the number of bits of input code data, and n is the number of bits of transmission code data, said encoding apparatus comprising:

encoding means for encoding parallel input m-bit code data to r-bit code data in which r is not less than said m and less than n;

post-encoding means for encoding said encoded r-bit code data to n-bit transmission code data, wherein r is set according to said minimum run length condition d.

19. An encoding apparatus for RLL code data as claimed in claim 18, wherein said encoding means comprises a look-up table of $2^m \times r$ bits.

20. An encoding apparatus for RLL code data as claimed in claim 18, wherein said post-encoding means comprises at least one mapper with an input word length and with an output word length interchanged from the input and the output shown in the Table 1:

TABLE 1

| d | i | j | reduction ratio |
|---|---|---|---|
| 1 | 4 | 3 | 3/4 |
| 2 | 3 | 2 | 2/3 |
| 3 | 5 | 3 | 3/5 |
| 4 | 6 | 3 | 1/2 |
| 5 | 9 | 4 | 4/9 |
| 6 | 10 | 4 | 2/5 |
| 7 | 11 | 4 | 4/11 |
| 8 | 12 | 4 | 1/3 |
| 9 | 16 | 5 | 5/16 |
| 10 | 17 | 5 | 5/17 |
| 11 | 18 | 5 | 5/18 |
| 12 | 19 | 5 | 5/19 |
| 13 | 20 | 5 | 1/4 |
| 14 | 21 | 5 | 5/21 |
| 15 | 22 | 5 | 5/22 |
| 16 | 23 | 5 | 5/23 |
| 17 | 24 | 5 | 5/24 |
| 18 | 25 | 5 | 1/5 | according to said run length condition.

21. An encoding apparatus for RLL code data as claimed in claim 20, wherein said mapper comprises a logic circuit.

22. An encoding apparatus for RLL code data as claimed in claim 20, wherein said mapper comprises one or more look-up tables.

23. An encoding apparatus for RLL code data as claimed in claim 18, wherein said RLL code satisfies the (d,k,m,n) condition of (2,12,8,15).

24. An encoding apparatus for RLL code data as claimed in claim 18, wherein said RLL code data satisfies the (d,k,m,n) condition of (2,10,8,14).

25. An encoding apparatus for RLL code data as claimed in claim 18, wherein said RLL code satisfies the (d,k,m,n) condition of (2,10,8,16).

26. An encoding apparatus for RLL code data as claimed in claim 18, said apparatus further comprising:

a first converting means for converting input serial m-bit code data into said parallel m-bit code data and for transmitting the converted parallel m-bit code data to said encoding means; and a second converting means for converting the parallel n-bit transmission code data transmitted from said post-encoding means into serial n-bit transmission code data.

27. An encoding and decoding apparatus for RLL code data satisfying a (d,k,m,n) condition in which d is a minimum run length, k is a maximum run length, m is the number of bits of input code data, n is the number of bits of transmission code data, said apparatus comprising:

encoding means for encoding input parallel m-bit code data to r-bit code data in which r is not less than m and less than n;

post-encoding means for encoding said r-bit code data to n-bit transmission code data;

pre-decoding means for decoding said n-bit transmission code data to said r-bit code data according to said minimum run length condition d; and decoding means for decoding said decoded r-bit code data to said original m-bit code data.

* * * * *